United States Patent [19]
Dresser et al.

[11] Patent Number: 5,278,801
[45] Date of Patent: Jan. 11, 1994

[54] FLEXIBLE ADDRESSING FOR DRAMS

[75] Inventors: Scott A. Dresser, Hudson; Raymond A. Ward, Billerica, both of Mass.

[73] Assignee: Hewlett-Packard Company, Palo Alto, Calif.

[21] Appl. No.: 938,113

[22] Filed: Aug. 31, 1992

[51] Int. Cl.$^5$ .............................................. G11C 13/00
[52] U.S. Cl. ......................... 365/230.02; 365/189.02; 365/233; 365/230.05
[58] Field of Search ............... 365/189.02, 230.02, 365/189.01, 230.01, 233, 230.05

[56] References Cited
U.S. PATENT DOCUMENTS

5,204,841  4/1993  Chappell et al. ............... 365/230.02

Primary Examiner—Terrell W. Fears

[57] ABSTRACT

A memory controller for controlling access to a memory includes a mapper for mapping a physical address to a row address and a column address that are suitable for addressing first and second memory devices having the same memory capacity but different addressing formats, a multiplexer for multiplexing the row address and the column address onto a set of address lines for addressing the memory and a circuit for generating control signals for controlling access to the memory. In a preferred embodiment, the first memory devices are 16 Mb DRAMs which require asymmetric addressing, and the second memory devices are 16 Mb DRAMs which require symmetric addressing. The memory controller of the invention generates a row address and a column address for addressing both types of memory devices without having knowledge of the types of memory devices that are present in the memory.

14 Claims, 9 Drawing Sheets

REGISTERS, 21

| START ADDRESS REGISTER 0 |
| START ADDRESS REGISTER 1 |
| START ADDRESS REGISTER 2 |
| START ADDRESS REGISTER 3 |
| START ADDRESS REGISTER 4 |
| START ADDRESS REGISTER 5 |
| START ADDRESS REGISTER 6 |
| START ADDRESS REGISTER 7 |
| DRAM TYPE REGISTER 0 |
| DRAM TYPE REGISTER 1 |
| DRAM TYPE REGISTER 2 |
| DRAM TYPE REGISTER 3 |
| DRAM TYPE REGISTER 4 |
| DRAM TYPE REGISTER 5 |
| DRAM TYPE REGISTER 6 |
| DRAM TYPE REGISTER 7 |

FLEXIBLE ADDRESSING FOR DRAMS

FIELD OF THE INVENTION

The present invention relates generally to data processing systems, and, more particularly, to addressing of dynamic random access memories (DRAMs).

DESCRIPTION OF THE PRIOR ART

The memory capacity of DRAM chips has been steadily increasing. The newest generation of DRAM chips is capable of holding 16 megabits (Mb) of information. The 16 Mb chips are available in one of two varieties. The first variety uses a symmetrical addressing scheme, much like that used by the smaller capacity DRAMs. In a symmetrical addressing scheme, the number of bits used for a row address is equal to the number of bits used for a column address. Thus, for instance, a 1 Mb DRAM employs a 9 bit (row address) by 9 bit (column address) address, and a 4 Mb DRAM employs a 10 bit by 10 bit address. The symmetric 16 Mb DRAM employs an 11 bit by 11 bit address.

The other variety of 16 Mb DRAM chip, however, employs an asymmetric addressing scheme (i.e., a scheme in which the number of bits used for the row address differs from the number of bits used for the column address). Specifically, this variety of chip employs a 12 bit row address by 10 bit column address. Therefore, the two different types of 16 Mb DRAM chips both use 22 bit addresses, but employ different addressing schemes.

The 16 Mb DRAM chips require a column address and a row address to specify a unique memory location. The row address and the column address are multiplexed into the DRAM chips over common address lines. Both a row address and a column address are needed, because the DRAMs are organized as a memory matrix having rows and columns. The row address specifies a row in the matrix, and the column address specifies a column in the matrix. Each location is specified by a unique combination of a column address and a row address.

Presently, it is difficult to utilize both types of 16 Mb DRAM chips in the same memory subsystem. Memory modules holding multiple DRAM chips typically supply to the memory controller bit codes that are hardwired on the module. The bit codes provide information as to the size of the module, the speed of the DRAM chips and other pertinent information. Unfortunately, the codes do not distinguish between the two types of 16 Mb DRAM chips. Hence, the system does not know whether a memory module that is identified as containing 16 Mb DRAM chips includes the first or second type of 16 Mb DRAM chips. Thus, the data processing system is designed to employ only one of the two types of DRAM chips, and the memory controller is designed to address the selected type of 16 Mb DRAM chips

SUMMARY OF THE INVENTION

In accordance with one aspect of the present invention, there is provided a memory controller for use in a data processing system. The data processing system includes a microprocessor that generates memory access requests for a memory block. Each memory access request includes a physical address for the memory block to be accessed. The data processing system also includes a memory that is controlled by the memory controller. The memory controller responds to the memory access requests. The memory comprises multiple memory devices of the same memory capacity, which may include first memory devices requiring a symmetric addressing format and second memory devices requiring an asymmetric addressing format.

The memory controller comprises a means for mapping the address bits of each memory access request into a row address and a column address. The memory controller also includes a means for multiplexing the row address and the column address onto a set of address lines for addressing the memory.

The memory devices are preferably dynamic random access memory chips such as 16 Mb dynamic random access memory chips. The memory chips may be organized into single in line memory modules (SIMMs). Further, at least one additional memory chip having a different memory capacity may be included in the memory. In a preferred embodiment, the first memory devices are 16 Mb DRAMs which require a 12 bit row address and a 10 bit column address, and the second memory devices are 16 Mb DRAMs which require an 11 bit row address and an 11 bit column address. The mapping means preferably generates a 12 bit row address and a 11 bit column address. Any extra bits of the row address or the column address are ignored by the memory devices. Preferably, at least one bit of the physical address is mapped into both the row address and the column address. Thus, the memory controller of the present invention can address memory devices that require symmetric addressing and memory devices that require asymmetric addressing without having knowledge of the types of memory devices that are present in the memory.

BRIEF DESCRIPTION OF THE DRAWINGS

The present invention is described in detail below with reference to the drawings, in which.

DETAILED DESCRIPTION OF A PREFERRED EMBODIMENT

A preferred embodiment of the present invention is described with reference to the drawings. The invention relates to a memory subsystem that operates with 1 Mb, 4 Mb and 16 Mb DRAM memory modules. Each memory module includes several DRAM chips. The memory subsystem determines what size memory modules are to be accessed by each memory access request and generates an appropriate address that is forwarded to the module. The memory controller generates addresses that work equally well for accessing symmetrically addressed 16 Mb DRAM chips and asymmetrically addressed DRAM chips.

Figure 1:
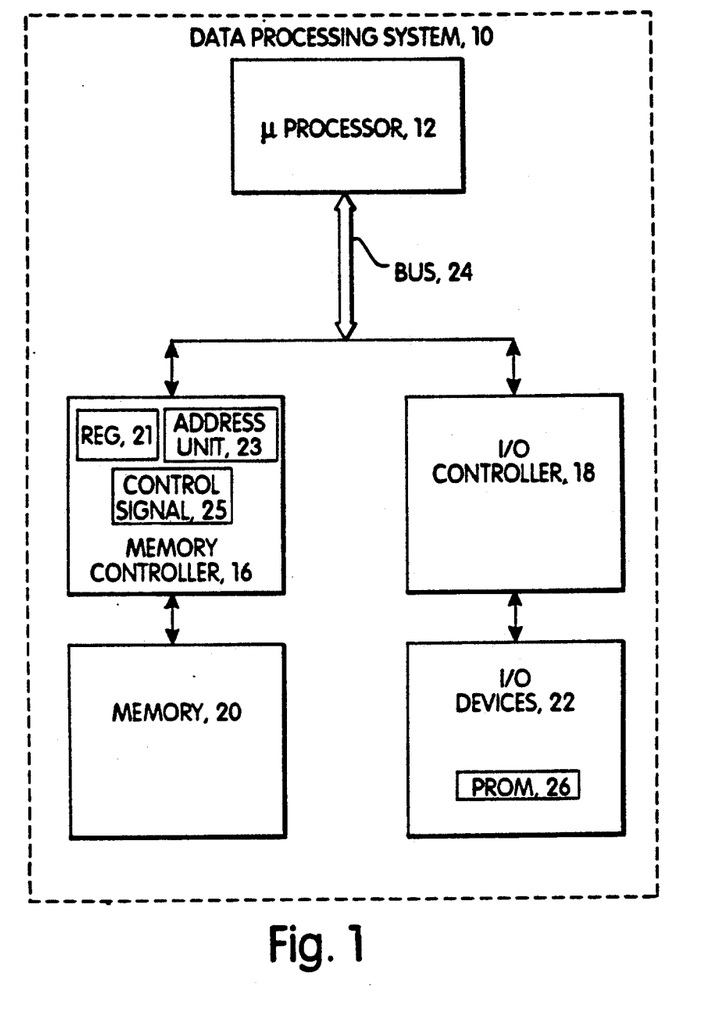
FIG. 1 is a block diagram of a data processing system 10 that is suitable for practicing a preferred embodiment of the present invention.

FIG. 1 shows a data processing system 10 suitable for implementing the present invention. The data processing system 10 includes a microprocessor 12 that directs the activities of the data processing system. The microprocessor 12 has access to a programmable read only memory (PROM) 26 that holds initialization routine code for execution on start up of the data processing system. The data processing system 10 also includes a memory subsystem, comprising a memory controller 16 and a memory 20. The memory controller 16 controls access to memory 20. The memory controller 16 contains a number of components, including registers 21, a control signal generator 25 and an address unit 23. The registers 21 are used to hold control and status information. The control signal generator 25 is used to generate control signals that are forwarded to the memory 20. The address unit 23 generates addresses that are applied to memory 20.

The data processing system 10 additionally includes an input/output (I/0) subsystem comprising an I/0 controller 18 and I/0 devices 22. The I/0 controller controls communications with the I/0 devices 22. The I/0 devices include PROM 26. The microprocessor 12, the PROM 26, memory controller 16 and I/0 controller 18 are all connected to a common bus 24. The bus 24 serves as the pathway for communications between components 12, 16, 18 and 24.

Figure 2:
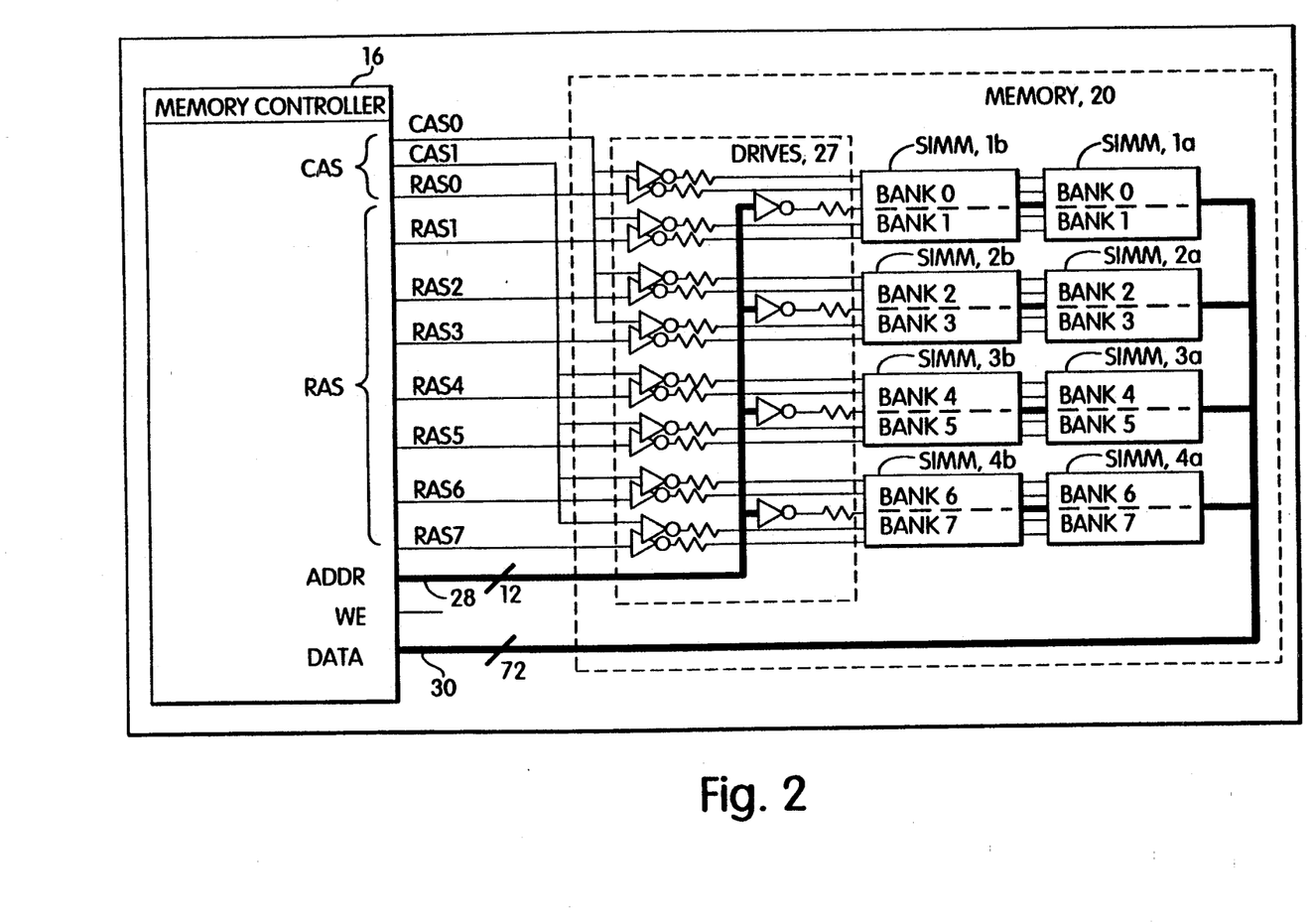
FIG. 2 is a more detailed schematic diagram of a memory subsystem of the data processing system 10 of FIG. 1.

FIG. 2 is a more detailed schematic diagram of the memory subsystem. An address bus 28 carries addresses from the memory controller 16 to the memory 20, and a data bus 30 carries data between memory 20 and the memory controller 16. The memory controller 16 provides a number of control signals to the memory 20 through the control signal generator 25. In particular, column address strobe (CAS) signals CAS0 and CAS1 and row address strobe (RAS) signals RAS0, RAS1, RAS2, RAS3, RAS4, RAS5, RAS6 and RAS7 are provided by memory controller 16. The CAS0 and CAS1 signals are used to strobe column addresses into the DRAM chips of memory 20. Similarly, the RAS0-RAS7 signals are used to strobe row addresses into the DRAM chips of memory 20. Before any location in memory 20 can be accessed, its column address and row address must be strobed into the DRAM chips using the CAS and RAS signals. Lastly, a write enable signal (WE) is provided by the memory controller to enable data to be written to the DRAM chips of memory 20.

Memory 20 includes a number of drivers 27 that receive and drive the CAS0 signal, CAS1 signal, RAS0 RAS7 signals and the addresses on address bus 28. The memory 20 further includes eight slots (not shown) in which memory modules may be inserted. Each slot may hold single memory module. A user of the system 10 has the option of populating the slots as he sees fit for a particular application. FIG. 2 illustrates an instance where each of the eight slots is fully loaded with a single in-line memory module (SIMM). SIMMs are well known industry standard modules. The preferred embodiment is configured to work with X36 ECC SIMMs. Slot zero is loaded with SIMM 1a; slot one is loaded with SIMM 1b; slot two is loaded with SIMM 2a; slot three is loaded with SIMM 2b, slot four is loaded with SIMM 3a; slot five is loaded with SIMM 3b; slot six is loaded with SIMM 4a; and slot seven is loaded with SIMM 4b. The SIMMs are addressed as pairs 1a and 1b, 2a and 2b, 3a and 3b, and 4a and 4b. The SIMMs of each respective pair (such as SIMMs 1a and 1b) are interconnected to receive the same RAS and CAS signals. The data bus 30 is connected to each pair of SIMMs such that bits 0–31 are connected to the first SIMM in the pair and bits 32–71 are connected to the second SIMM in the pair.

Each SIMM may include up to 18 DRAM chips. These chips may be, for instance, 1 Mb chips, 4 Mb chips or 16 Mb chips. However, all of the chips on a single SIMM are of the same memory capacity. Thus, a SIMM may include all 1 Mb chips, all 4 Mb chips, or all 16 Mb chips. Furthermore, in SIMMs having 16 Mb DRAM chips, all of the DRAM chips must be of the same type (i.e., either all 16 Mb chips that employ symmetric addressing or 16 Mb chips that employ asymmetric addressing). In addition, each of the paired SIMMs must include chips of the same memory capacity.

Each SIMM may be fully populated or half populated. A fully populated SIMM includes 9 DRAM chips on each of its sides (18 DRAM chips in total). A half-populated SIMM includes only 9 DRAM chips on a single side. The other side of the SIMM lacks any DRAM chips.

The DRAM chips on corresponding sides of each pair of SIMMs constitute a DRAM bank. As an example, the DRAM chips on one side of SIMMs 1a and 1b form DRAM bank 0. The DRAM chips on the other side of SIMMs 1a and 1b form DRAM bank 1. Accordingly, SIMMs 2a and 2b include DRAM banks 2 and 3; SIMMs 3a and 3b include DRAM banks 4 and 5; and SIMMs 4a and 4b include DRAM banks 6 and 7.

Figure 3:
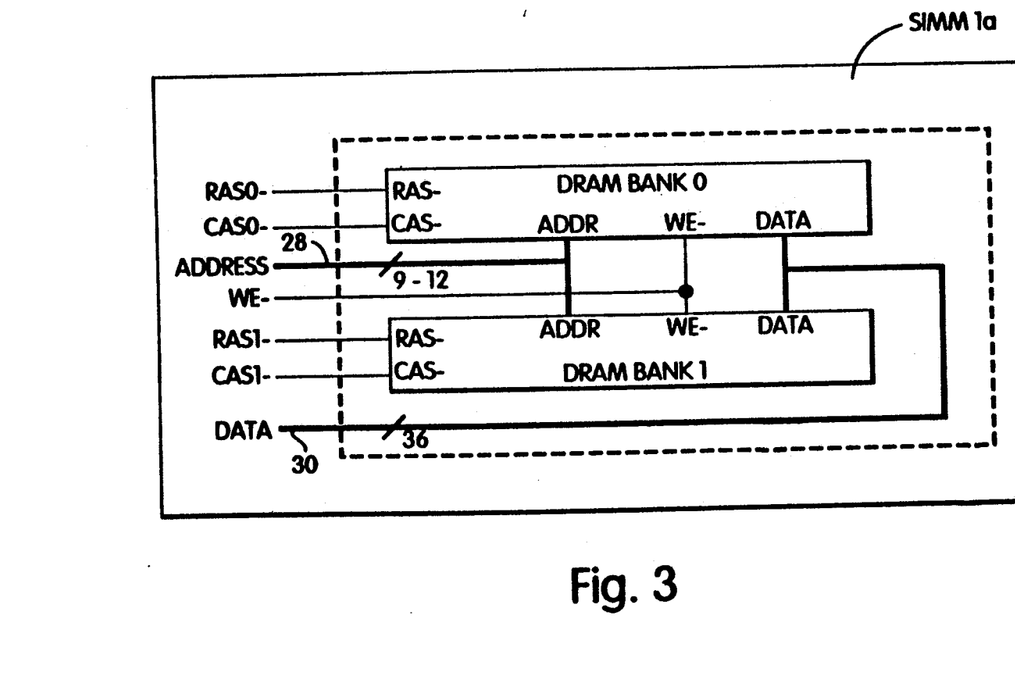
FIG. 3 is a more detailed depiction of a SIMM in the memory subsystem of FIG. 2.

FIG. 3 is a more detailed schematic diagram of SIMM 1a. The SIMMs 1b, 2a, 2b, 3a, 3b, 4a and 4b have the same construction. SIMM 1a includes chips for DRAM bank and DRAM bank 1. The data lines of DRAM banks 0 and 1 are coupled to the data bus 30. Similarly, the address lines of DRAM banks 0 and 1 are coupled to the address bus 28. Depending on the size of the DRAM chips included on the SIMM 1a, the address bus may carry an address having 9 to 12 bits. DRAM bank 0 receives the RAS0 signal an the CAS0 signal. DRAM bank 1 receives the RAS1 signal and the CAS1 signal. Both of the DRAM banks 0 and 1 are also connected to receive the write enable (WE) signal from memory controller 16.

The memory space of the DRAM chip in SIMMs 1a, 1b, 2a, 2b, 3a, 3b, 4a and 4b is organized into a memory matrix of rows and columns. The RAS signals strobe a row address into the DRAM chips. The RAS0-RAS7 signals also are used to activate a given DRAM bank. Specifically, the DRAM chips of a bank remain in a standby state until a RAS signal is received. The RAS signal brings the DRAM chips of the bank to an active state.

Access to memory 20 is effected by appropriate application of the RAS, CAS and address signals. As an example, assume that a request is made to read a memory location in memory 20. The row address is placed on address bus 28 and then an appropriate one of the RAS0-RAS7 signals is asserted to activate the DRAM bank containing that row. For instance, assume that the row address is contained in DRAM bank 0. The RAS0 signal is asserted to strobe the address on address bus 28 into SIMM 1a and SIMM 1b. A column address is then placed on address bus 28, and a CAS signal is asserted to strobe the column address into DRAM banks. Only the DRAM bank that has been activated by a RAS signal uses the column address that is strobed in by a CAS signal. For the example discussed above, the CAS0 signal is asserted to strobe the column address into the DRAM chips of bank 0. The data held in the memory location specified by the row address and column address in each of the 18 DRAMs of DRAM bank 0 is output to the data bus 30. As each DRAM chip entry is 4 bits in length, the 18 chips produce 72 bits on data bus 30. A write operation is similar except that the write enable (WE) signal must be asserted, and the data on the data bus 30 is written into the addressed location.

Figure 4:
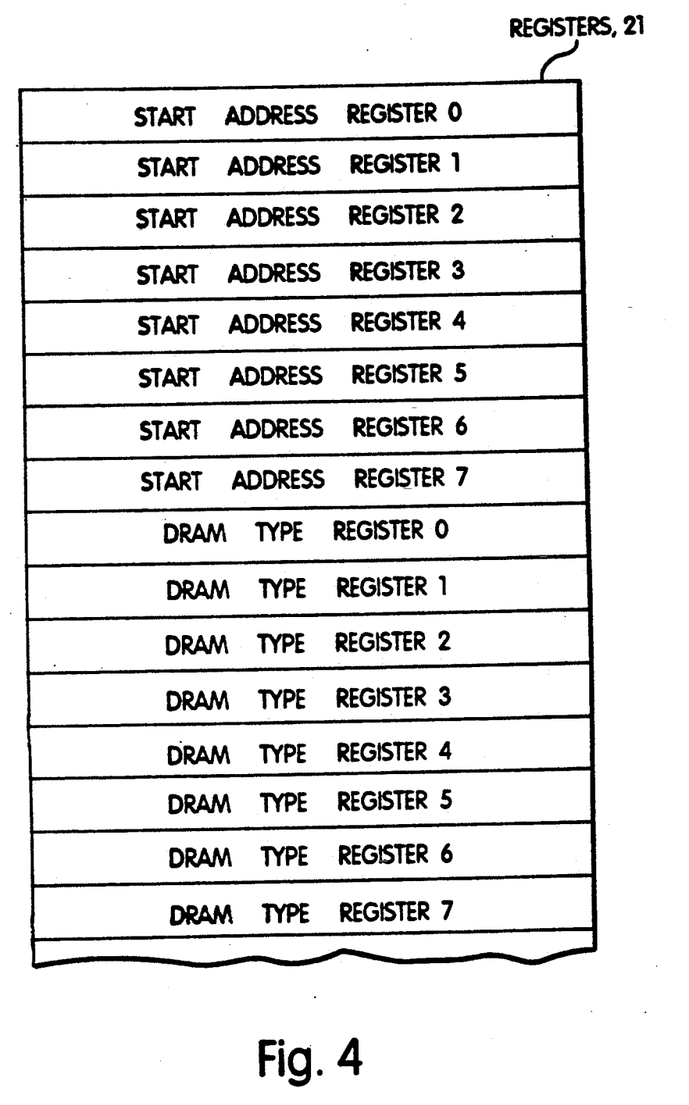
FIG. 4 is a schematic representation of a portion of the registers 21 of FIG. 1.

In order to understand how the row addresses and column addresses are generated, it is necessary to discuss the components of memory controller 16. The registers 21 in memory controller 16 hold status and control information. As shown in FIG. 4, the registers 21 include start address registers 0-7 and DRAM type registers 0-7. The start address registers 0-7 hold the start address for each of the DRAM banks in memory 20 (FIG. 2). The DRAM type registers 0-7 hold a type indicator that specifies the type of DRAM chips (i.e., 1 Mb, 4Mb, 16 Mb) that are contained within the specified DRAM bank. The DRAM type registers 0-7 do not differentiate between 16 Mb DRAM chips that employ symmetric addressing and 16 Mb DRAM chips that employ asymmetric addressing. Both are viewed merely as 16 Mb DRAM chips by the DRAM type registers 0-7. It will be appreciated by those skilled in the art that the physical implementation shown in FIG. 4 is merely illustrative and other physical implementations are equally viable. For instance, certain of the registers may be combined to enhance efficiency.

The start address registers 0-7 and the DRAM type registers 0-7 are loaded with data upon system start-up. In particular, at system start up, the microprocessor 12 (FIG. 1) begins executing an initialization routine that is stored in PROM 26. The SIMMs 1a, 1b, 2a, 2b, 3a, 3b, 4a and 4b each have a set of presence detect pins which indicate the capacity of memory in the SIMM and the type of DRAM chips in the SIMM (i.e., 1 Mb chips, 4 Mb chips or 16 Mb chips). Using the information obtained from the presence detect pins, the microprocessor executes the initialization routine to determine the starting addresses for each DRAM bank and the types of DRAMs in each of the respective banks. This information is then loaded into start address registers 0-7 and DRAM type registers 0-7, respectively.

Figure 5:
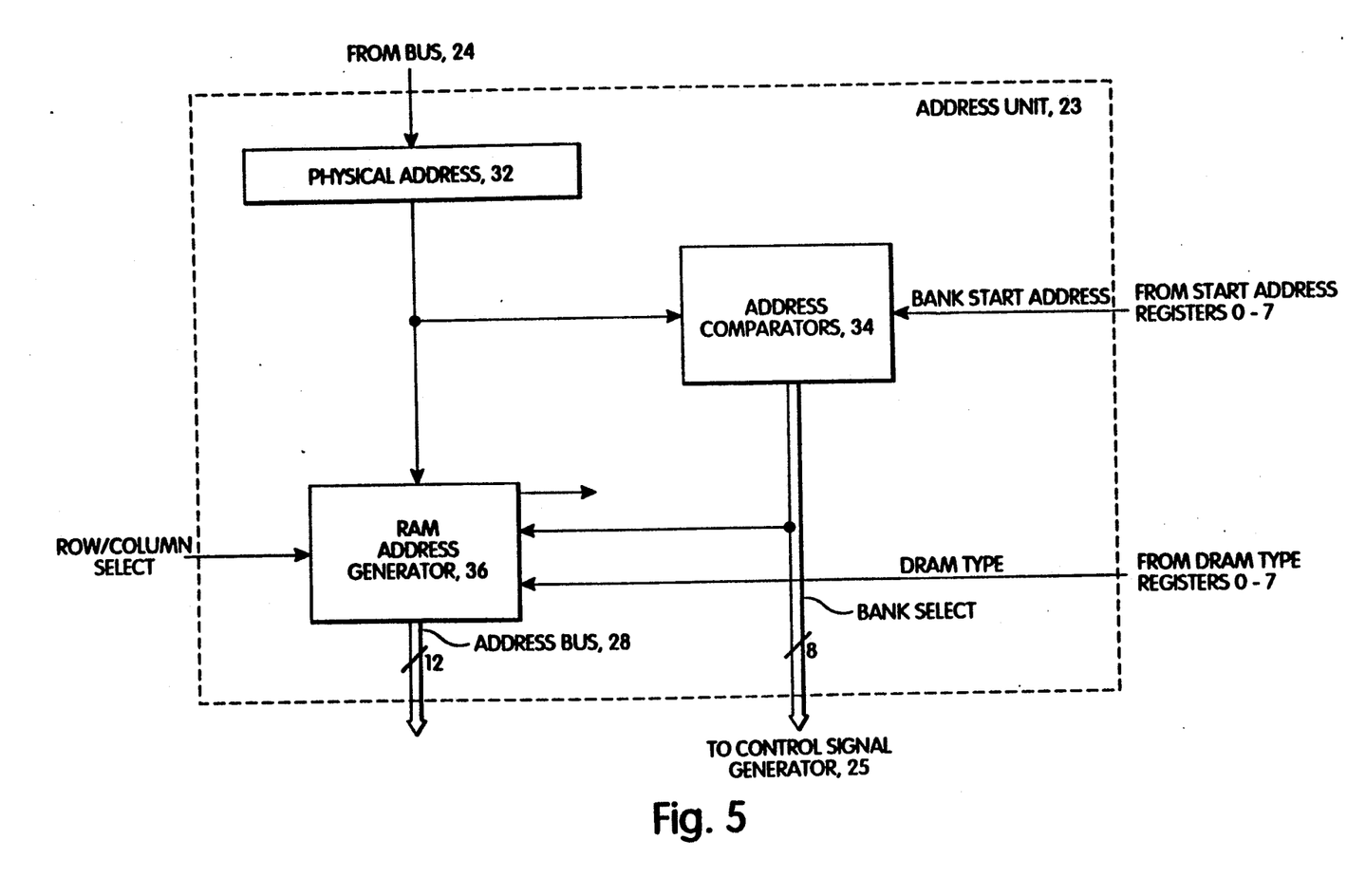
FIG. 5 is a schematic representation of the address unit 23 of the memory controller 16 of FIG. 1.

The information in the start address registers 0-7 and the DRAM type registers 0-7 is utilized by the address unit 23 (FIG. 1) to generate row addresses and column addresses. FIG. 5 shows the address unit 23 in more detail. The address 23 unit includes a register 32 for holding an incoming physical address from bus 24 (FIG. 1). The physical address is placed on the bus 24 by microprocessor 12. The physical address held in register 32 is passed to a RAM address generator 36 and to address comparators 34. The address comparators 34 compare the physical address with each of the starting addresses for DRAM banks 0-7. The bank start addresses are held in the start address registers 0-7 (FIG. 4). The bank to be selected is the bank having the greatest start address of the starting addresses of the banks, that is less than the physical address. The address comparators 34 generate a bank select output that indicates which bank has been selected. The bank select signal is input to the control signal generator 25, which uses the bank select signal in generating control signals, and to the RAM address generator 36.

The RAM address generator 36 generates addresses that are passed to the SIMM modules of memory 20. The RAM address generator receives the address from register 32 as input, along with several other inputs. Specifically, the bank select signal generated by address comparators 34 is input to the RAM address generator 36. In addition, the RAM address generator 36 receives from the DRAM type registers an indicator of the type of DRAM chips that are contained in the selected bank. Lastly, the RAM address generator 36 receives a row-/column select signal that indicates whether a row address or a column address is to be generated. This select signal is generated by other logic circuitry in memory controller 16.

Figure 6A:
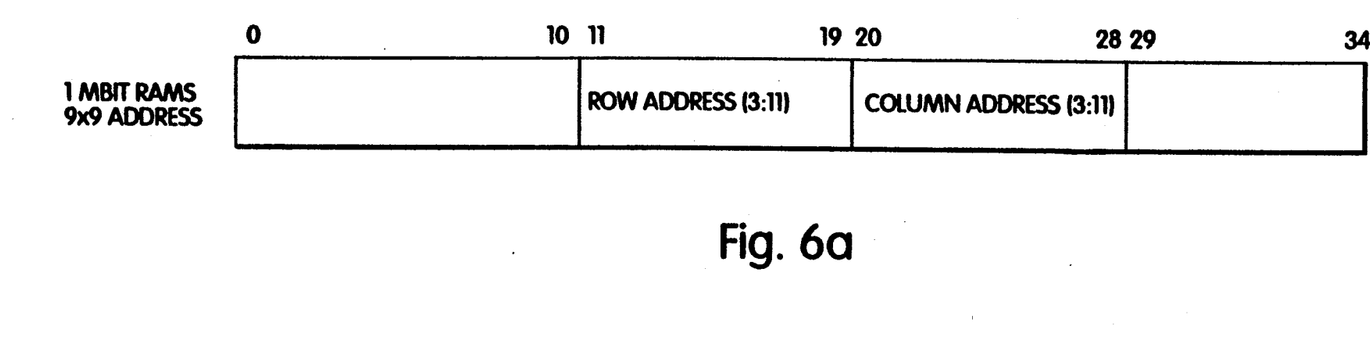
FIGS. 6a-6d depict different address formats for different types of DRAM chips.

In order to understand the operation of the RAM address generator 36, it is necessary to consider the different address formats that may be employed within the data processing system 10 (FIG. 1). As discussed above, different size DRAM chips may be used in the SIMM modules of memory 20. In particular, 1 Mb DRAM chips, 4 Mb DRAM chips and/or 16 Mb DRAM chips may be employed. FIG. 6a depicts the mapping of an address that is sent by the microprocessor 12 (FIG. 1) on bus 24 into a row address and a column address for 1 Mb DRAM chips. In this case, the address is a 9 bit row address by 9 bit column address. Bits 11-19 (FIG. 6a) of the address on bus 24 specify the row address, and bits 20-28 specify the column address.

Figure 6B:
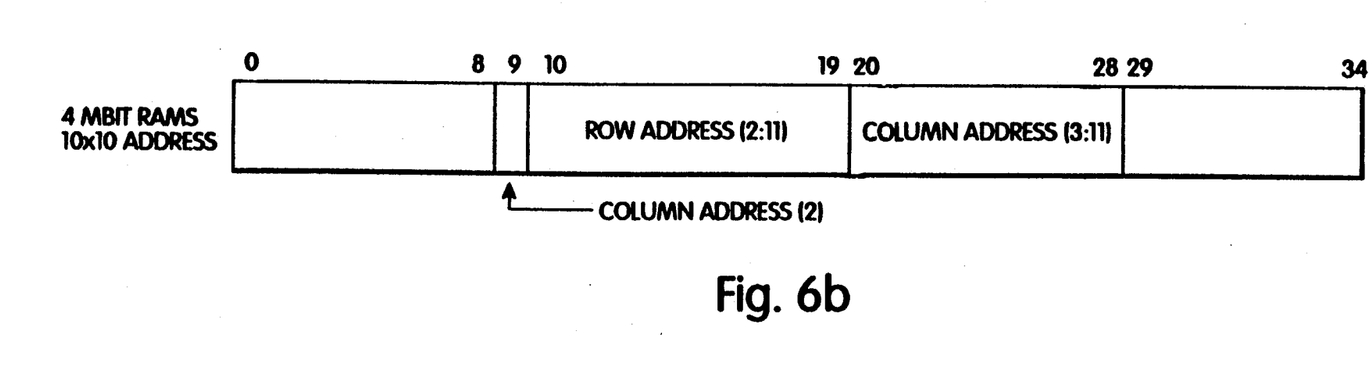

FIG. 6b shows the address mapping for an address on bus 24 (FIG. 1) to a row address and a column address for 4 Mb DRAM chips. The address is a 10 bit by 10 bit address. The row address is specified by bits 10-19 (FIG. 6b) of the address on bus 24, and the column address is specified by bit 9 and bits 20-28. Bit 9 is the high order bit for the column address.

Figure 6C:
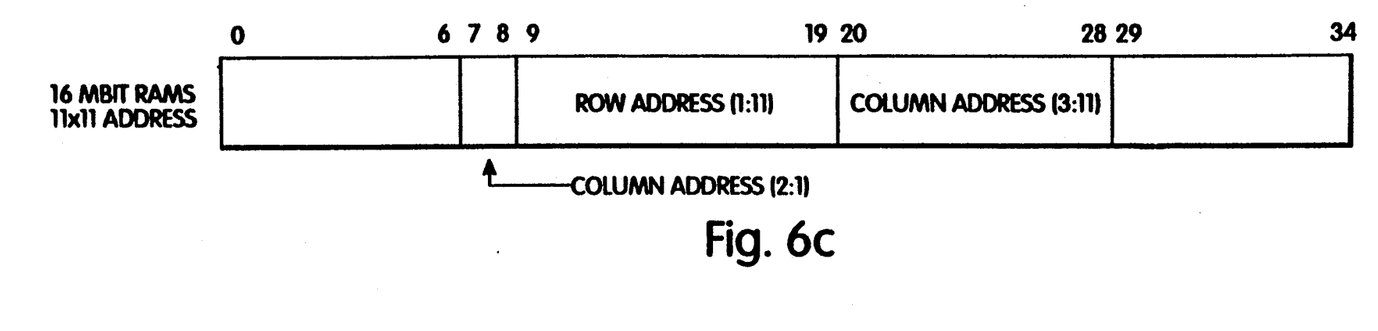

FIG. 6c shows the address mapping for an address on bus 24 (FIG. 1) to a row address and a column address for 16 Mb DRAM chips that use symmetric addressing. The address for such chips is an 11 bit by 11 bit address. The row address is specified by bits 9-19 (FIG. 6c) of the address on bus 24 (FIG. 1), and the column address is specified by bits 7, 8 and 20-28 (FIG. 6c). Bits 7 and 8 are the high order bits of the column address.

Figure 6D:
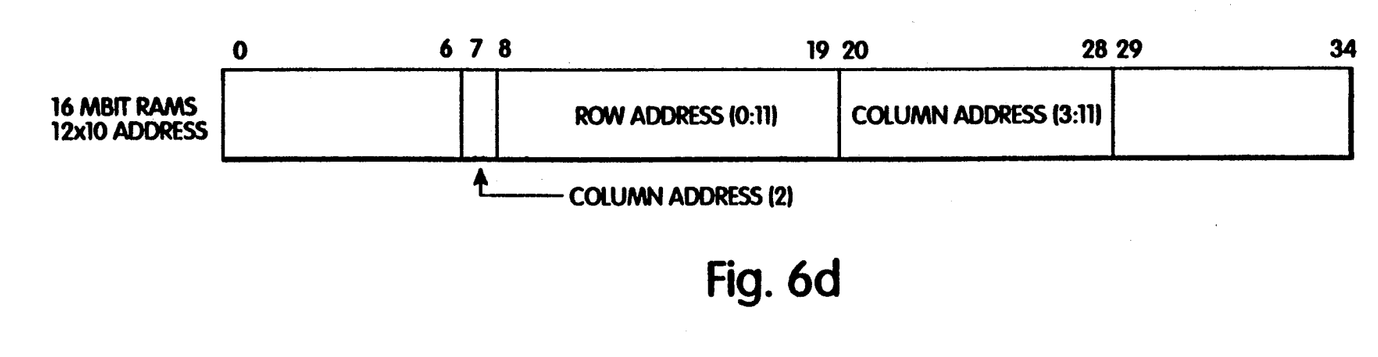

FIG. 6d shows the address mapping for an address on bus 24 (FIG. 1) to a row address and a column address for 16 Mb DRAM chips that use asymmetric addressing. In this instance the address is 12 bits by 10 bits. The row address is specified by bits 8-19 of the address (FIG. 6d) on bus 24, and the column address is specified by bits 7 and 20-28 (FIG. 6d). Bit 7 is the high order bit of the column address.

Figure 7:
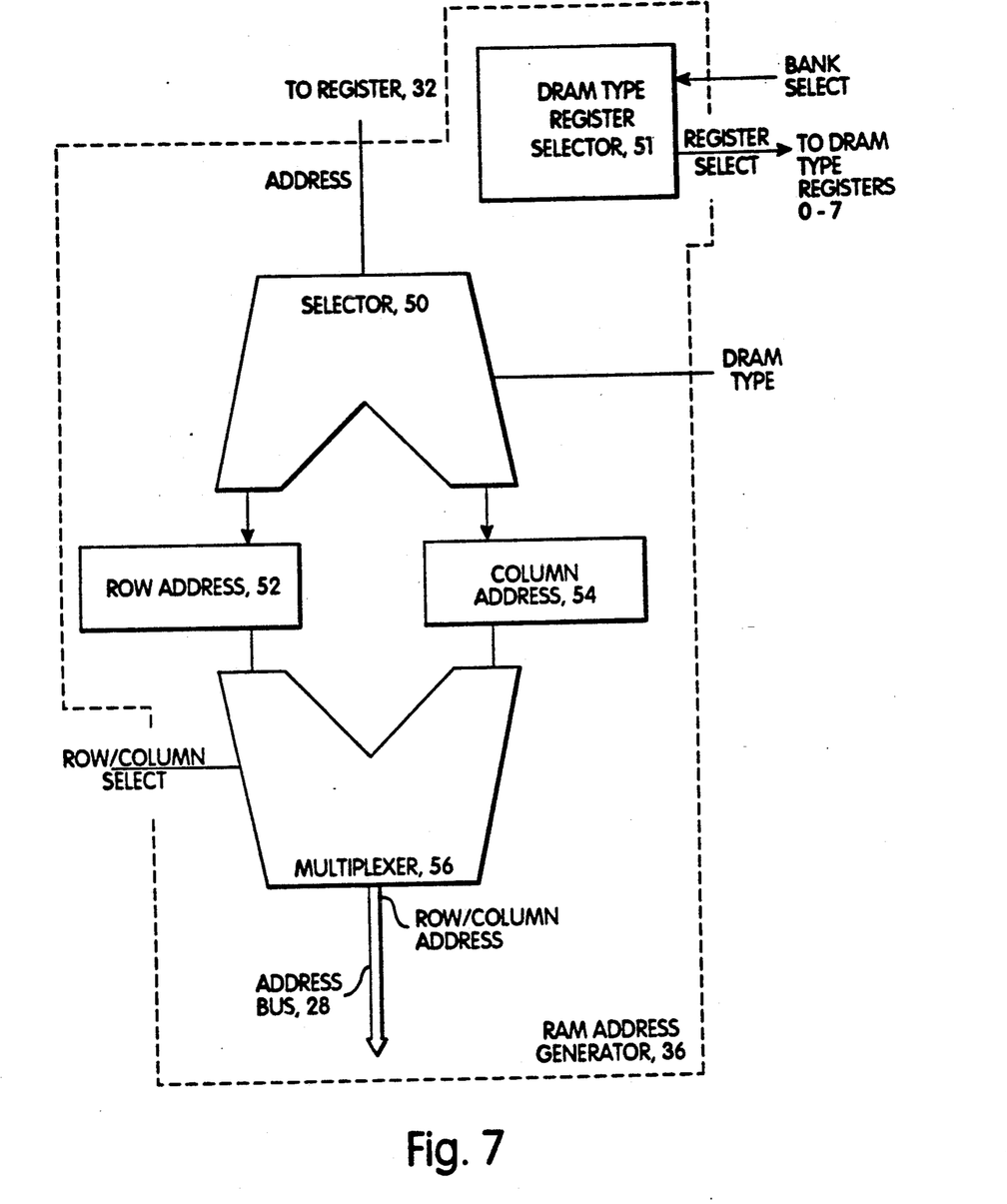
FIG. 7 is a schematic diagram of the RAM address generator 36 of FIG. 5.

The RAM address generator 36 (FIG. 5) must account for all of the possible address formats (i.e., the formats shown in FIGS. 6a-6d). The RAM address generator 36 achieves this goal using circuitry as shown in FIG. 7. The RAM address generator 36 includes a DRAM type register selector 5 that receives the bank select output from the address comparators 34 (FIG. 5) to determine which register should be selected. The DRAM type register selector 51 (FIG. 7) outputs a register select signal to one of the DRAM type registers 0-7 that is associated with the bank that is selected by the bank select signal. The RAM address generator 36 also includes a selector 50 and a multiplexer 56. The selector 50 receives the physical address from register 32 and selects whether each of the bits in the physical address is passed to the row address 52, passed to the column address 54 or not used in either the row address or column address. The DRAM type signal from the selected DRAM type register indicates the type of DRAM chips to be addressed (i.e., 1 Mb, 4 Mb or 16 Mb DRAM chips) and controls the selection performed by the selector 50. The multiplexer 5 then determines whether the row address 52 or the column address 54 is output on the address bus 28. The selection of the row address 52 or the column address 54 is determined by the row/column select input to the multiplexer 56.

If the DRAM type input to selector 50 indicates that the address is for 1 Mb DRAM chips, bits 11-19 of the address received by the selector form bits 3-11 of the row address 52 and bits 20-28 of the address input to the selector form bits 3-11 of the column address 54. In other words, the selector 50 acts to map the address as shown in FIG. 6a. Analogously, if the DRAM type input indicates that the address if for 4 Mb DRAM chips, the address is mapped as shown in FIG. 6b.

Figure 8:
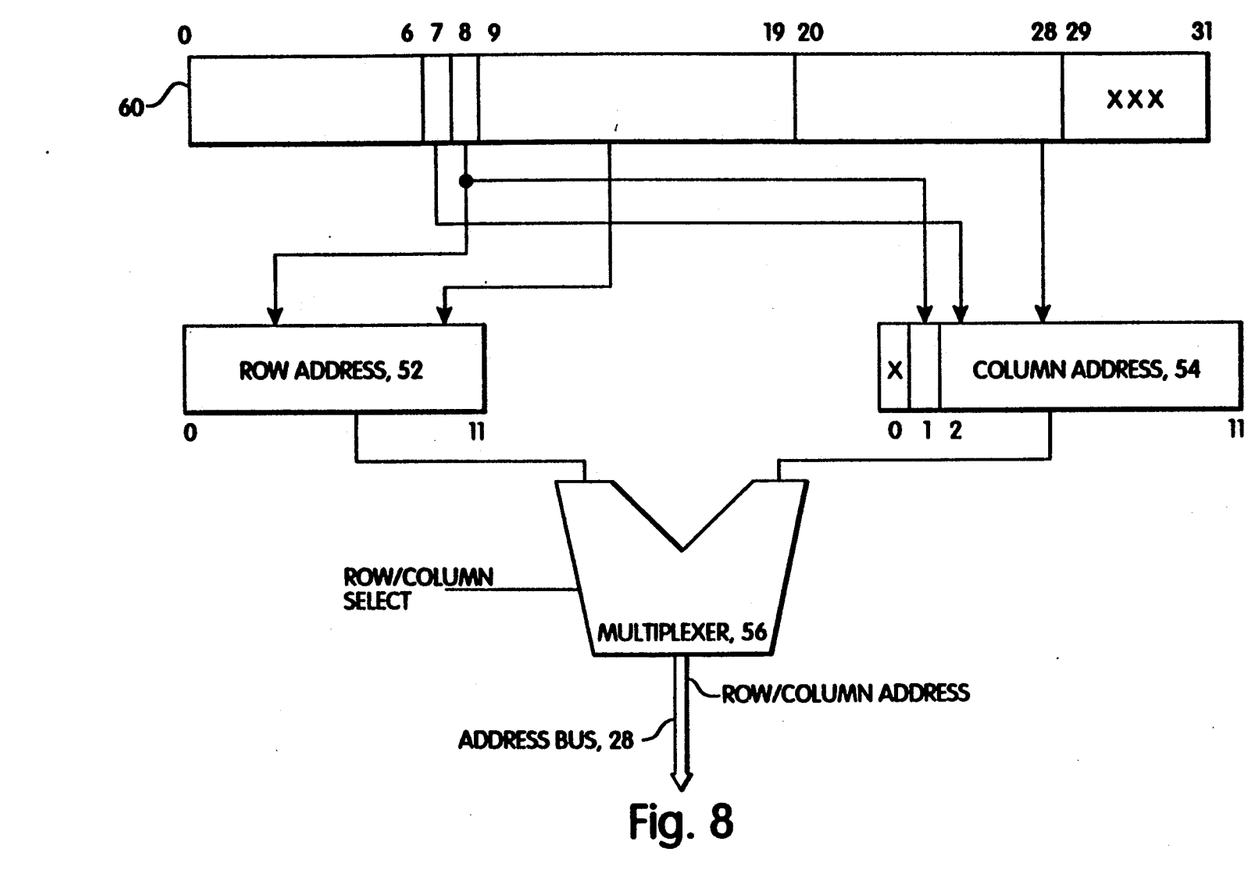
FIG. 8 is a diagram depicting the mapping of an address on bus 24 to a row address and a column address for 16 Mb chips.

However, when the DRAM type bit indicates that the address is for 16 Mb DRAM chips, the address may be mapped as shown in either FIG. 6c or FIG. 6d. Hence, the mapping is performed as shown in FIG. 8 so that the system need not be concerned with whether the 16 Mb DRAM chips require symmetric addressing or asymmetric addressing. In particular, the address 60 from register 32 is mapped into a row address 52 and a column address 54. The row address 52 has 12 bits (0:11) and the column address 54 has 12 bits (0:11). Actually, the column address has only 11 bits (i.e. bits 1:11). Bit 0 is never used. The row address 52 is formed from bit 8 and bits 9-19 of the address 60. Bit 8 is mapped to the high order bit position 0 of the row address 52. The remaining bits 9-19 of address 60 are mapped to bits 1-11 of the row address 52.

The column address 54 is formed by mapping bits 7, 8, and 20-28 of address 60 on bus 24 (FIG. 1) to the column address. Bit 8 of address 60 (FIG. 8) is mapped to the second highest order position 1 of the column address 54. Bit 7 is mapped to the next highest order of position 2 of the column address 54. Bits 20-28 of address 60 are mapped to the remaining low order of bit positions 3-11 of the column address 54.

The row address 52 and the column address 54 are fed to two inputs of the multiplexer 56. The row and column address generated in this fashion may be applied to any of the 16 Mb DRAM chips in memory.

In order to understand how the row address 52 and the column address 54 may be applied to any of the respective memory chips, it is helpful to examine the address mapping shown in FIGS. 6c-6d. For the 16 Mb DRAMs that use symmetric addressing (see FIG. 6c), 11 bits from the row address 52 (FIG. 8) and 11 bits from the column address 54 are used. Accordingly, bit 0 in the row address 52 and bit 0 in the column address 54 are ignored by the 16 Mb DRAM chips that use symmetric addressing. The 16 Mb chips that use asymmetric addressing (see FIG. 6d) use all 12 bits of the row address 52 (FIG. 8) but only 10 bits of the column address 54. As such, bits 0 and 1 of the column address 54 are ignored by the asymmetric 16 Mb DRAM chips. In the above-described instances, the ignored bits that are loaded into the high order bits are of no relevance.

When the row address and column address have been derived from the physical address, multiplexer 56 (FIG. 7) determines whether the row address or column address is to be output. The row/column select signal, discussed above in connection with FIG. 5, is the control line for the multiplexer 56 (FIG. 7). The selected row/column address is output on address bus 28 to the DRAM chips of the active bank as discussed above.

The preferred embodiment, thus, provides enhances flexibility in the type of modules that may be employed in the memory subsystem of a data processing system. Moreover, it achieves this flexibility without requiring additional hardware or software.

While the present invention has been shown with respect to preferred embodiments thereof, those skilled in the art will know of other alternative embodiments which do not depart from the spirit and scope of the invention as defined in the appended claims

I claim:

1. A memory controller for controlling access to a memory, comprising:
    a means for mapping a physical address to a row address and a column address, that are suitable for addressing first memory devices having a first address format and second memory devices having a second address format, said first and second memory devices having the same memory capacity;
    means for multiplexing said row address and said column address onto a set of address lines for addressing the memory; and
    means for generating control signals for controlling access to the memory by said row address and said column address.

2. A memory controller as defined in claim 1 wherein the first memory devices and the second memory devices require different numbers of column address bits and different numbers of row address bits.

3. A memory controller as defined in claim 1 wherein said means for mapping generates a row address and a column address that is suitable for addressing first memory devices comprising 16 Mb DRAMs which require a 12 bit row address and a 10 bit column address, and second memory devices comprising 16 Mb DRAMs which require an 11 bit row address and an 11 bit column address.

4. A memory controller as defined in claim 3, wherein said means for mapping generates a 12 bit row address and a 11 bit column address.

5. A memory controller as defined in claim 1 wherein said means for mapping includes means for mapping at least one bit of the physical address into both the row address and the column address.

6. A memory controller as defined in claim 2 wherein said means for mapping generates a row address and a column address having equal numbers of bits.

7. In a data processing system having a microprocessor that generates memory access requests which includes address bits of a memory block, a memory controller for responding to the memory access requests, and a memory, said memory comprising multiple memory chips of the same memory capacity, wherein at least one of said memory chips requires a symmetric addressing format and at least one of said chips requires an asymmetric addressing format, said memory controller comprising:
    a) an address mapper for mapping the address bits of each memory access request into a row address and a column address, wherein at least one of the address bits is mapped to both the row address and the column address; and
    b) means for forwarding the row address and the column address to the memory.

8. In a data processing system having a microprocessor that generates memory access requests which include address bits of a block of memory, a memory subsystem, comprising:
  a) a memory comprising memory chips of the same memory capacity, wherein at least one of said memory chips requires a symmetric address and at least one of said memory chips requires an asymmetric address; and
  b) a memory controller for responding to the memory access requests, comprising:
    i) an address mapper for mapping the address bits of each memory access request into a row address and a column address wherein at least one of the address bits is mapped to both the row address and the column address; and
    ii) means for forwarding the row address and the column address to the memory such that any extra bits in the column address or the row address are ignored by the memory.

9. A memory subsystem as recited in claim 8 wherein the memory chips comprise dynamic random access memory (DRAM) chips.

10. Memory subsystem as recited in claim 9 wherein the memory chips comprise 16 megabit DRAM chips.

11. A memory subsystem as recited in claim 8 wherein the memory chips are organized into single in line memory modules (SIMMs).

12. A memory subsystem as recited in claim 11 wherein the memory chips comprise 16 megabit DRAM chips.

13. A memory subsystem as recited in claim 8 further comprising at least one additional memory chip of a memory capacity that differs from the memory capacity of other of the memory chips.

14. In a data processing system having a microprocessor, memory having at least one memory chip that employs symmetric addressing and at least one memory chip that employs asymmetric addressing, a memory controller and a microprocessor, a method comprising the steps of:
  a) receiving at the memory controller a memory block address from the microprocessor of a memory location to be accessed;
  b) mapping the memory block address from the microprocessor into a row address and a column address such that at least one bit in the memory block address is mapped to both the row address and the column address;
  c) forwarding said row address and said column address to the memory chips of the memory regardless of whether said memory chips employ symmetric addressing or asymmetric addressing; and
  d) ignoring at the memory chips, extra bits provided in the row address or the column address so that the memory block is accessed.

* * * * *